US011776929B2

(12) United States Patent
Umeda et al.

(10) Patent No.: US 11,776,929 B2
(45) Date of Patent: Oct. 3, 2023

(54) SEMICONDUCTOR DEVICE AND LEAD FRAME MEMBER

(71) Applicant: SHINDENGEN ELECTRIC MANUFACTURING CO., LTD., Tokyo (JP)

(72) Inventors: Soichiro Umeda, Saitama (JP); Atsushi Kyutoku, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 15/734,996

(22) Filed: Dec. 4, 2020

(65) Prior Publication Data

US 2021/0233885 A1 Jul. 29, 2021

(51) Int. Cl.
*H01L 23/00* (2006.01)
*H01L 23/053* (2006.01)
*H01L 23/495* (2006.01)

(52) U.S. Cl.
CPC ........... *H01L 24/32* (2013.01); *H01L 23/053* (2013.01); *H01L 23/49517* (2013.01); *H01L 23/49562* (2013.01); *H01L 2224/32245* (2013.01)

(58) Field of Classification Search
None
See application file for complete search history.

(56) References Cited

U.S. PATENT DOCUMENTS 3,708,730 A * 1/1973 Schierz ............ H01L 23/49541
257/674
2001/0025964 A1 10/2001 Loddenkotter et al.
2007/0114352 A1* 5/2007 Victor R. Cruz ...........................
H01L 23/49548
257/E23.047
(Continued)

FOREIGN PATENT DOCUMENTS

EP 2312916 A2 4/2011
JP 3691402 B2 9/2005
JP 201672575 A 5/2016

OTHER PUBLICATIONS

International Search Report in PCT/JP2019/015614, dated Jun. 25, 2019, 2pp.
Search Report in NL2025196, dated Aug. 26, 2020, 16pp.

*Primary Examiner* — Michelle Mandala
*Assistant Examiner* — Jordan M Klein
(74) *Attorney, Agent, or Firm* — HAUPTMAN HAM, LLP

(57) ABSTRACT

A semiconductor device includes: an inner substrate on which a semiconductor chip is mounted, and has a surface on which terminals including electric path terminals are formed; a lead frame which has a chip connecting electrode portion which is electrically connected to a surface of the semiconductor chip via a conductive bonding member, substrate connecting electrode portions which are electrically connected to the electric path terminals of the inner substrate, and horizontal surface support portions which bulge to the outside from the chip connecting electrode portion or the substrate connecting electrode portions; and pin terminals which are mounted upright over the inner substrate in a direction perpendicular to flat surfaces of the substrate connecting electrode portions of the lead frame, (Continued)

wherein the horizontal surface support portions bulge to the outside of the inner substrate.

13 Claims, 4 Drawing Sheets

(56) References Cited

U.S. PATENT DOCUMENTS

| | | | |
|---|---|---|---|
| 2009/0246910 A1* | 10/2009 | Taniguchi | H01L 23/5385 |
| | | | 438/107 |
| 2011/0080714 A1* | 4/2011 | Tsukada | H01L 23/3735 |
| | | | 174/257 |
| 2015/0371937 A1 | 12/2015 | Yoshihara et al. | |
| 2016/0079133 A1* | 3/2016 | Nashida | H01L 25/18 |
| | | | 257/690 |
| 2016/0099224 A1 | 4/2016 | Yoshimatsu et al. | |
| 2017/0236782 A1* | 8/2017 | Nonaka | H01L 25/072 |
| | | | 257/667 |
| 2017/0271230 A1* | 9/2017 | Inaba | H01L 23/3735 |
| 2018/0114735 A1* | 4/2018 | Nakamura | H01L 23/3121 |

* cited by examiner

E — E

F — F

SEMICONDUCTOR DEVICE AND LEAD FRAME MEMBER

RELATED APPLICATIONS

The present application is a National Phase of International Application Number PCT/JP2019/015614, filed Apr. 10, 2019.

TECHNICAL FIELD

The present invention relates to a semiconductor device and a lead frame member.

BACKGROUND ART

Patent document 1 discloses a semiconductor device where a lead frame is bonded to an inner substrate and a semiconductor chip mounted on the inner substrate via a conductive bonding member. In the manufacture of the lead frame of such a semiconductor device, a lead frame member is bonded to the semiconductor chip and the inner substrate in a state where the lead frame is connected to an inner side of an outer frame portion of the lead frame member and, thereafter, the lead frame is separated from the outer frame portion by cutting. Patent document 2 discloses a semiconductor device where external connection terminals adopt a pin terminal structure.

As shown in FIG. 4A, a conventional semiconductor device 601 disclosed in patent document 1 includes: an inner substrate 402 on which a semiconductor chip 403 is mounted; a lead frame 404 which is bonded to the inner substrate 402 and the semiconductor chip 403 via a conductive bonding member 406; and a mold resin 407 which seals these members by a resin with a part of these members exposed to the outside. In the manufacture of the lead frame 404, in a state where the lead frame 404 forms a part of the lead frame member, portions 445 where the lead frame 404 is bonded to an outer frame portion (not shown in the drawing) are exposed from the mold resin 407 as external connection terminals as shown in FIG. 4A and FIG. 4B.

Further, in the semiconductor device 401, the lead frame 404 has: a chip connecting electrode portion 441 which is bonded to an electrode of the semiconductor chip 403; and portions 443 which bulge from the chip connecting electrode portion 441 to the outside of a profile of the semiconductor chip 403. Distal ends of the bulging portions 443 are, as shown in FIG. 4C, bonded to portions of electric path terminals 423 mounted on the inner substrate 402 via conductive bonding members 406. The bulging portions 443 of the lead frame 404 are received by the inner substrate 402 via thin conductive bonding members 406. Accordingly, in the manufacture of the lead frame 404, the lead frame 404 is bonded in a state where the inclination of the lead frame 404 due to its own weight is restricted to some extent.

A conventional semiconductor device 501 disclosed in patent document 2 is a semiconductor device having a so-called pin terminal structure. As shown in FIG. 5, the semiconductor device 501 includes pin terminals 505 bonded to an inner substrate 502 as external connection terminals. The pin terminals 505 are mounted on the inner substrate 502 perpendicular to a surface of the inner substrate 502, and are exposed from a mold resin 507. The semiconductor device having such a pin terminal structure can shorten an electric path.

PRIOR ART DOCUMENT

Patent Document

Patent document 1: JP 2016-072575
Patent document 2: JP 3691402 B2

SUMMARY OF INVENTION

Problem to be Solved by the Invention

However, in the above-mentioned semiconductor device 401, the bulging portions 443 are received via conductive bonding members 406 even though the conductive bonding members 406 are thin and hence, there is a concern that the lead frame 404 is bonded in a state where the lead frame 404 is inclined due to its own weight. Further, in the semiconductor device 401, the bulging portions 443 are received by the inner substrate 402 and hence, in a case where the inner substrate 402 is inclined, there is a concern that the lead frame 404 is bonded in an inclined manner with respect to the mold resin 407. When the lead frame is bonded in an inclined manner, there arises a drawback that pitch accuracy with respect to distal ends of the external connection terminals is deteriorated. Particularly, in the case of the semiconductor device having a pin terminal structure, when a surface of the inner substrate over which pin terminals are mounted upright has an inclination, the pin terminals are inclined thus giving rise to a drawback that pitch accuracy with respect to the distal ends of the pin terminals is deteriorated.

The present invention has been made to overcome the above-mentioned drawbacks, and it is an object of the present invention to provide a semiconductor device having a pin terminal structure where the semiconductor device can acquire favorable pitch accuracy with respect to distal ends of external connection terminals. It is another object of the present invention to provide a lead frame member used in a semiconductor device having a pin terminal structure where the semiconductor device can acquire favorable pitch accuracy with respect to distal ends of external connection terminals.

Solution to Problem

[1] According to the present invention, there is provided a semiconductor device which includes: an inner substrate on which a semiconductor chip is mounted, and has a surface on which a terminal including an electric path terminal is formed; a lead frame which has a chip connecting electrode portion which is electrically connected to a surface of the semiconductor chip via a conductive bonding member, a substrate connecting electrode portion which is electrically connected to the electric path terminal of the inner substrate, and a horizontal surface support portion which bulges to an outside from the chip connecting electrode portion or the substrate connecting electrode portion as viewed in a plan view; and a pin terminal which is electrically connected to the substrate connecting electrode portion of the lead frame, and is mounted upright over the inner substrate in a direction perpendicular to a flat surface of the substrate connecting electrode portion, wherein the horizontal surface support portion bulges to an outside of the inner substrate as viewed in a plan view.

[2] In the semiconductor device of the present invention, it is preferable that a distal end of the horizontal surface support portion be brought into contact with neither the inner substrate nor the semiconductor chip.

[3] In the semiconductor device of the present invention, it is preferable that the chip connecting electrode portion, the substrate connecting electrode portion, and the horizontal surface support portion extend along a same plane, and the pin terminal be electrically connected to the electric path terminal formed on the inner substrate via a conductive bonding member.

[4] In the semiconductor device of the present invention, it is preferable that the lead frame have, as the horizontal surface support portion, first horizontal surface support portions which bulge from one pair of opposite sides of the inner substrate and second horizontal surface support portions which bulge from the other pair of opposite sides of the inner substrate, and the first horizontal surface support portions and the second horizontal surface support portions form a horizontal surface support mechanism.

[5] In the semiconductor device of the present invention, it is preferable that a plurality of the horizontal surface support portions which form the horizontal surface support mechanism be formed with substantially a same width.

[6] In the semiconductor device of the present invention, it is preferable that the chip connecting electrode portion have an embossed projection having a height corresponding to a thickness of the conductive bonding member formed on a surface of the semiconductor chip.

[7] In the semiconductor device of the present invention, it is preferable that the inner substrate further have an insulation terminal, and the lead frame further include an insulation terminal connecting portion which is electrically connected to the insulation terminal via a conductive bonding member, and an entirety of the lead frame except for a portion of the insulation terminal connecting portion be covered by a mold resin.

[8] According to the present invention, there is provided a lead frame member formed into a lead frame of a semiconductor device by working, the semiconductor device including: an inner substrate on which a semiconductor chip is mounted and has a surface on which a terminal including an electric path terminal is formed; and the lead frame which is electrically connected to the semiconductor chip and the inner substrate, and as viewed in a plan view where the lead frame member overlaps with the inner substrate, wherein the lead frame member includes: an outer frame portion which has a frame shape and surrounds the inner substrate; a chip connecting electrode portion at least a portion of which overlaps with the semiconductor chip; a substrate connecting electrode portion at least a portion of which overlaps with the electric path terminal of the inner substrate; a first horizontal surface support portion which has one end connected to the chip connecting electrode portion or the substrate connecting electrode portion, and has the other end connected to the outer frame portion; and a second horizontal surface support portion which has one end connected to the substrate connecting electrode portion, and has the other end positioned outside the inner substrate thus forming a free end.

[9] In the lead frame member of the present invention, it is preferable that the outer frame portion, the chip connecting electrode portion, the substrate connecting electrode portion, and the horizontal surface support portion extend along a same plane.

[10] In the lead frame member of the present invention, it is preferable that, as viewed in a plan view where the lead frame member overlaps with the inner substrate, a through hole be formed in the lead frame member at a position where the through hole overlaps with the electric path terminal.

[11] In the lead frame member of the present invention, it is preferable that, as viewed in a plan view where the lead frame member overlaps with the inner substrate on which an insulation terminal is formed as a portion of the terminal, the lead frame member further include an insulation terminal connecting portion which has one end overlapping with the insulation terminal, and has the other end connected to the outer frame portion.

Advantageous Effects of Invention

According to the semiconductor device of the present invention, the semiconductor device has the lead frame which has the horizontal surface support portion which bulges to the outside of the inner substrate from the chip connecting electrode portion or the substrate connecting electrode portion as viewed in a plan view. Accordingly, in the manufacture of the semiconductor device, the lead frame can be arranged while suppressing inclining of the lead frame by receiving the horizontal surface support portion by a fixing jig. As a result, it is possible to acquire favorable pitch accuracy with respect to distal ends of the external connection terminals which are bonded to the lead frame. Further, according to the semiconductor device of the present invention, the semiconductor device includes the pin terminal which is mounted upright over the inner substrate in a direction perpendicular to the flat surface of the substrate connecting electrode portion and hence, it is possible to provide the pin terminal structure where the external connection terminal is formed of the pin terminal. As a result, the semiconductor device according to the present invention becomes a semiconductor device having a pin terminal structure having favorable pitch accuracy with respect to distal ends of the external connection terminals.

According to the lead frame member of the present invention, as viewed in a plan view where the lead frame member overlaps with the inner substrate, the lead frame member includes: the first horizontal surface support portion which has one end connected to the chip connecting electrode portion or the substrate connecting electrode portion, and the other end connected to the outer frame portion; and the second horizontal surface support portion which has one end connected to the substrate connecting electrode portion, and has the other end positioned outside the inner substrate thus forming a free end. With such a configuration, according to the lead frame member of the present invention, in the manufacture of the semiconductor device, the lead frame member can be arranged while suppressing inclining of the lead frame member by receiving the first and second horizontal surface support portions by a fixing jig. As a result, it is possible to acquire favorable pitch accuracy with respect to distal ends of the external connection terminals which are bonded to the lead frame member. Further, as viewed in a plan view where the lead frame member overlaps with the inner substrate, the lead frame member of the present invention includes the substrate connecting electrode portion at least a portion of which overlaps with the electric path terminal of the inner substrate. Accordingly, the pin terminal can be bonded to the electric path terminal of the inner substrate via the substrate connecting electrode portion and hence, it is possible to provide a pin terminal structure where the external connection terminal is formed of the pin terminal. As a result, the lead frame member according to the present invention becomes a lead frame member used in a semiconductor device having a pin terminal structure where the semiconductor device can acquire favorable pitch accuracy with respect to distal ends of external connection terminals.

BRIEF DESCRIPTION OF DRAWINGS

FIG. 1A is a top plan view showing an internal structure of the semiconductor device 1 in a see-through manner, FIG. 1B is a cross-sectional view taken along a line A-A in FIG. 1A, FIG. 1C is a cross-sectional view taken along a line B-B in FIG. 1A, and FIG. 1D is a cross-sectional view taken along a line C-C in FIG. 1A.

FIG. 3A is a top plan view, and FIG. 3B is a cross-sectional view taken along a line D-D in FIG. 3A.

FIG. 4A is a top plan view showing an internal structure of a semiconductor device 401 in a see-through manner, FIG. 4B is a cross-sectional view taken along a line E-E in FIG. 4A, and FIG. 4C is a cross-sectional view taken along a line F-F in FIG. 4A.

DESCRIPTION OF EMBODIMENTS

Figure 1A:
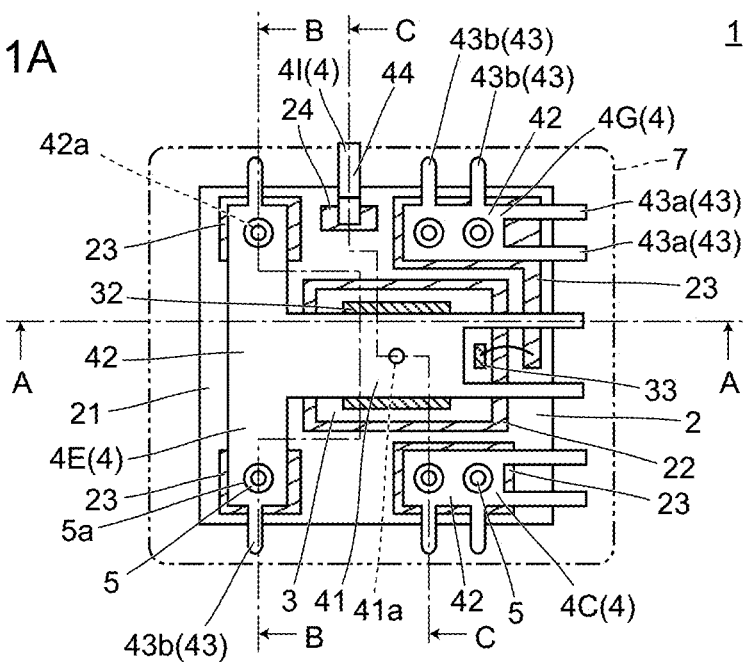
FIG. 1A to FIG. 1D are schematic views showing a semiconductor device 1 according to an embodiment.
Figure 1B:
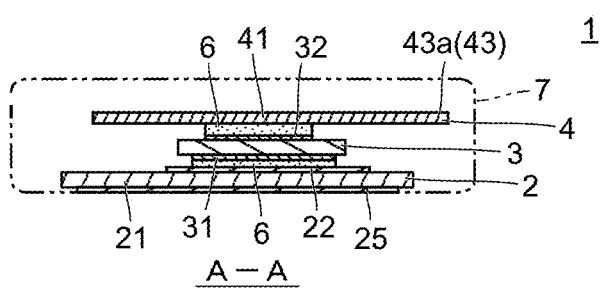
Figure 1C:
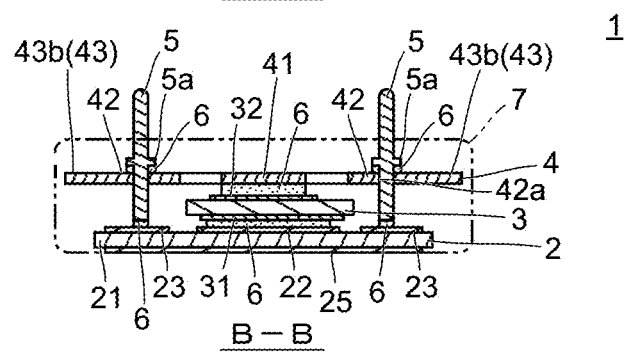
Figure 1D:
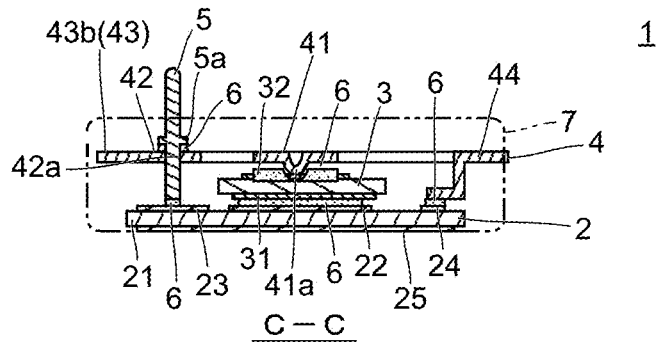

Hereinafter, a semiconductor device according to the present invention is described based on an embodiment shown in the drawings. The respective drawings are schematic views, and do not always strictly reflect actual sizes.

1. Configuration of Semiconductor Device 1 in Embodiment

As shown in FIG. 1A to FIG. 1D, the semiconductor device 1 according to the embodiment includes: an inner substrate 2; a semiconductor chip 3; a lead frame 4; pin terminals 5; and conductive bonding members 6. The semiconductor device 1 is sealed by a mold resin 7 except for portions of the lead frame 4 and distal end sides of the pin terminals 5.

The inner substrate 2 is an electric circuit board. As the inner substrate, although a suitable substrate (for example, a printed circuit board) can be used, the inner substrate 2 according to the embodiment is a DCB (direct copper bonding) board having: an insulation base material 21; a chip connecting terminal 22 which is exposed on one surface of the insulation base material 21 for mounting a chip; a plurality of electric path terminals 23 which form portions of an electric circuit and are exposed on one surface of the insulation base material 21; an insulation terminal 24 which is not electrically connected to the electric circuit and is exposed on one surface of the insulation base material 21; and a heat-radiation metal plate 25 which is exposed on the other surface of the insulation base material 21. The heat-radiation metal plate 25 is exposed from the mold resin 7.

The semiconductor chip 3 is mounted on the inner substrate 2. The semiconductor chip 3 is an IGBT having: a collector electrode 31 formed on one surface (a surface on an inner substrate 2 side); and an emitter electrode 32 and a gate electrode 33 disposed at a position spaced apart from the emitter electrode 32, both the emitter electrode 32 and the gate electrode 33 being formed on the other surface (a surface on a side opposite to the surface on the inner substrate 2 side). The collector electrode 31 is bonded to the chip connecting terminal 22 of the inner substrate 2 via the conductive bonding member 6. The emitter electrode 32 is bonded to the lead frame 4 via the conductive bonding member 6. The gate electrode 33 is connected to the inner substrate 22 via a conductive member such as a wire or a jumper.

The lead frame 4 is formed of a plurality of pieces of flat-plate-like metal members, and is formed by separating the lead frame 4 from a lead frame member 40 (see FIG. 2) of the semiconductor device 1 described later by cutting. The lead frame 4 is formed of divided pieces consisting of: a lead frame collector piece 4C which is electrically connected to the collector electrode 31 of the semiconductor chip 3; a lead frame emitter piece 4E which is electrically connected to the emitter electrode 32 of the semiconductor chip 3; a lead frame gate piece 4G which is electrically connected to the gate electrode 33 of the semiconductor chip 3; and a lead frame insulation piece 41 which is not electrically connected to the semiconductor chip. The lead frame 4 has a larger cross-sectional area than a cross-sectional area of a wire and hence, the lead frame 4 allows a large electric current to flow through the lead frame 4. The lead frame 4 has a chip connecting electrode portion 41, substrate connecting electrode portions 42, a horizontal surface support mechanism 43, and an insulation terminal connecting portion 44. The chip connecting electrode portion 41, the substrate connecting electrode portions 42, and the horizontal surface support mechanism 43 extend along the same plane, and a height of the plane is set to a fixed height. An entirety of the lead frame 4 is covered by a mold resin 7 except for one end portion of the insulation terminal connecting portion 44.

The chip connecting electrode portion 41 is electrically connected to the emitter electrode 32 formed on the surface of the semiconductor chip 3 via the conductive bonding member 6. The chip connecting electrode portion 41 is formed on the lead frame emitter piece 4E. The chip connecting electrode portion 41 has an embossed projection 41a having a height corresponding to a thickness of the conductive bonding member 6 between the semiconductor chip 3 and the chip connecting electrode portion 41 at a center portion of a surface of the chip connecting electrode portion 41 on a semiconductor chip 3 side. At the time of placing the chip connecting electrode portion 41 on the semiconductor chip 3, a vertex of the embossed projection 41a is brought into contact with the semiconductor chip 3. Accordingly, a fixed amount of gap is ensured between the surface of the chip connecting electrode portion 41 and the surface of the semiconductor chip 3 and hence, the chip connecting electrode portion 41 is bonded to the semiconductor chip 3 via the conductive bonding member 6 having a sufficient thickness.

The substrate connecting electrode portions 42 are electrically connected to the electric path terminals 23 of the inner substrate 2 via the pin terminals 5 described later. In the substrate connecting electrode portions 42, through holes 42a each having a shape corresponding to an outer profile of the pin terminal 5 described later are formed at positions where the through holes 42a overlap with the electric path terminals 23 of the inner substrate 2 when the substrate connecting electrode portions 42 are made to overlap with the inner substrate 2 (see also FIG. 2). The substrate connecting electrode portion 42 is formed on the lead frame collector piece 4C, the lead frame emitter piece 4E, and the lead frame gate piece 4G respectively. A part of the substrate connecting electrode portion 42 formed on the lead frame emitter piece 4E is connected to the chip connecting electrode portion 41.

The horizontal surface support mechanism 43 is formed of a plurality of horizontal surface support portions which respectively bulge toward the outside from the chip connecting electrode portion 41 or from the substrate connecting electrode portions 42 as viewed in a plan view. The horizontal surface support mechanism 43 is formed of first horizontal surface support portions 43a and a plurality of second horizontal surface support portions 43b each of which forms a horizontal surface support portion. The first horizontal surface support portions 43a and the second horizontal surface support portions 43b are formed such that these horizontal surface support portions 43a, 43b have substantially the same width. Distal ends of the first horizontal surface support portions 43a and distal ends of the second horizontal surface support portions 43b are brought into contact with neither the inner substrate 2 nor the semiconductor chip 3 thus forming free ends respectively.

The first horizontal surface support portions 43a bulge from one pair of opposite sides of the inner substrate (sides opposite to each other in a lateral direction in FIG. 1A). The first horizontal surface support portions 43a are formed on the lead frame collector piece 4C, the lead frame emitter piece 4E, and the lead frame gate piece 4G respectively. The first horizontal surface support portions 43a formed on the lead frame emitter piece 4E bulge from the chip connecting electrode portion 41.

The second horizontal surface support portions 43b bulge from the other pair of opposite sides of the inner substrate 2 (sides opposite to each other in a vertical direction in FIG. 1A). The second horizontal surface support portions 43b are formed on the lead frame collector piece 4C, the lead frame emitter piece 4E, and the lead frame gate piece 4G respectively. The second horizontal surface support portions 43b of the lead frame emitter piece 4E bulge from the substrate connecting electrode portion 42.

The insulation terminal connecting portion 44 is electrically connected to the insulation terminal 24 of the inner substrate 2 via the conductive bonding member 6. The insulation terminal connecting portion 44 is bent in a crank shape, has one end connected to the insulation terminal 24, and has the other end slightly exposed from a side surface of the mold resin 7. The insulation terminal connecting portion 44 is formed on the lead frame insulation piece 41.

The pin terminal 5 is an elongated circular-columnar-shaped conductive pin having a large-diameter flange portion 5a at a center portion thereof. The pin terminal 5 is disposed such that one side of the pin terminal 5 is inserted into the through hole 42a formed in the lead frame 4 from a side opposite to an inner substrate 2 side, and is mounted upright over the inner substrate 2 in a direction perpendicular to a flat surface of the substrate connecting electrode portion 42. The pin terminal 5 has one end portion bonded to the inner substrate 2 via the conductive bonding member 6, and one surface of the flange portion 5a is bonded to the lead frame 4 via the conductive bonding member 6. With such a configuration, the pin terminal 5 is electrically connected to the substrate connecting electrode portion 42 of the lead frame 4, and is electrically connected to the electric path terminal 23 formed on the inner substrate 2. The other side of the pin terminal 5 projects from a surface of the mold resin 7, and functions as an external connection terminal.

The conductive bonding member 6 may be made of an alloy or metal having conductivity and adhesiveness. Although a silver paste or a conductive adhesive agent which contains silver nanoparticles may be adopted as the conductive bonding member, in this embodiment, the conductive bonding member 6 is a solder formed by melting a solder material by heating and by solidifying a melted solder material. The conductive bonding member 6 may be a lead-free solder. The conductive bonding member 6 is used at a plurality of positions between the respective terminals of the inner substrate 2, the respective electrodes of the semiconductor chip 3, the lead frame 4, and the pin terminals 5, and the conductive bonding member 6 join these elements to each other mechanically and connects these elements to each other electrically.

A suitable resin is used as the mold resin 7, and the mold resin 7 seals the inner substrate 2, the semiconductor chip 3, the lead frame 4, the pin terminals 5, and the conductive bonding member 6 by resin sealing except for portions of the heat radiation metal plate 25 of the inner substrate 2, portions of the insulation terminal connecting portion 44 of the lead frame 4, and portions of the pin terminals 5.

2. Configuration of Lead Frame Member 40 in Embodiment

Figure 2:
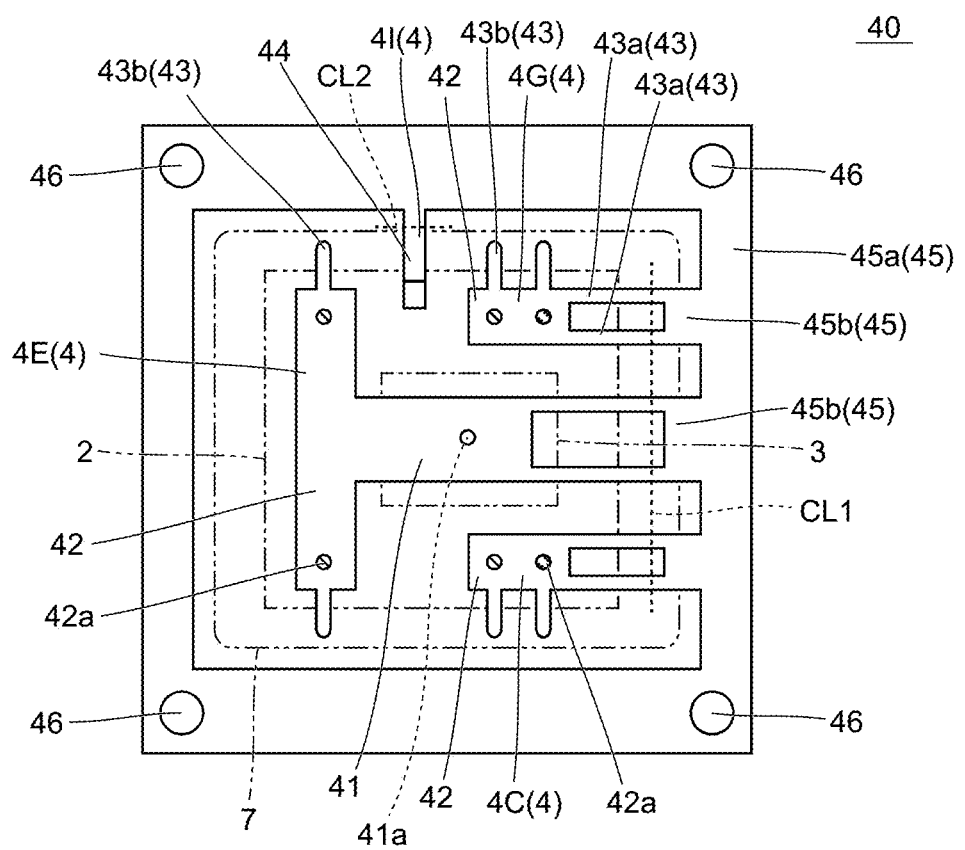
FIG. 2 is a schematic view showing a lead frame member 40 according to the embodiment.

As described previously, although the lead frame 4 is formed of the plurality of pieces, the lead frame 4 is formed by separating the lead frame 4 from the lead frame member 40 in one sheet form in a manufacturing step of the semiconductor device 1. The lead frame member 40 used in the manufacture of the semiconductor device 1 of this embodiment is described hereinafter. The lead frame member 40 is a lead frame member which is formed into the lead frame 4 of the semiconductor device 1 by working. As shown in FIG. 2, the lead frame member 40 includes an outer frame portion 45, the chip connecting electrode portion 41, the substrate connecting electrode portions 42, the first horizontal surface support portions 43a, the second horizontal surface support portions 43b, and the insulation terminal connecting portion 44. The lead frame member 40 is a rectangular-shaped metal-made flat plate having openings and through holes therein as a whole, wherein the outer frame portion 45, the chip connecting electrode portion 41, the substrate connecting electrode portions 42, the first horizontal surface support portions 43a, and the second horizontal surface support portions 43b extend along the same plane. By cutting the lead frame member 40 along a first cut line CL1 and a second cut line CL2 at the time of manufacturing the lead frame 40, an inner portion of the lead frame member 40 is separated from the lead frame member 40 as the lead frame 4. Portions of the lead frame member 40 other than the outer frame portion 45 basically have substantially the same configuration as the lead frame 4 described above and hence, in the description made hereinafter, the detailed configuration of such portions is omitted.

The outer frame portion 45 of the lead frame member 40 has a frame portion 45a and connecting portions 45b, and surrounds a periphery of the inner substrate 2 as viewed in a plan view where the outer frame portion 45 overlaps with the inner substrate 2. The frame portion 45a is formed in a rectangular frame shape. A positioning through hole 46 may be formed in four corners or the like of the frame portion 45a respectively. The connecting portions 45b connect the frame portions 45a and portions which are disposed inside the frame portion 45a and are scheduled to form the lead frame 4 to each other. For example, the connecting portions 45b connect the frame portion 45a and the first horizontal surface support portions 43a to each other. In FIG. 2, the positioning through hole 46 formed at four portions of the frame portion 45a respectively has a true circular shape. However, a portion of the positioning through hole 46 may be formed in an elliptical shape by taking into account a relief, or may be formed only at two portions of the frame portion 45a.

The chip connecting electrode portion 41 of the lead frame member 40 is a portion which is scheduled to form the chip connecting electrode portion 41 of the lead frame 4. As viewed in a plan view where the chip connecting electrode portion 41 overlaps with the inner substrate 2, at least a portion of the chip connecting electrode portion 41 overlaps with the semiconductor chip 3. Also an embossed projection 41a is formed on a center portion of the chip connecting electrode portion 41 of the lead frame member 40.

The substrate connecting electrode portions 42 of the lead frame member 40 are portions which are scheduled to form the substrate connecting electrode portions 42 of the lead frame 4. As viewed in a plan view where the substrate connecting electrode portions 42 overlap with the inner substrate 2, at least portions of the substrate connecting electrode portions 42 overlap with the electric path terminals 23 of the inner substrate 2 respectively. As viewed in a plan view where the substrate connecting electrode portions 42 overlap with the inner substrate 2, the through holes 42a are formed also in the substrate connecting electrode portions 42 of the lead frame member at positions which overlap with the electric path terminals 23.

The first horizontal surface support portions 43a of the lead frame member 40 are portions which are scheduled to form the first horizontal surface support portions 43a of the lead frame 4. One ends of the first horizontal surface support portions 43a are connected to the chip connecting electrode portion 41 or the substrate connecting electrode portions 42. The other ends of the first horizontal surface support portions 43a of the lead frame member 40 form free ends when the first horizontal surface support portions 43a are separated from the lead frame member 40 by cutting. However, the other ends of the first horizontal surface support portions 43a are connected to the connecting portions 45b of the outer frame portion 45 until the first horizontal surface support portions 43a are separated by cutting from the lead frame member 40.

The second horizontal surface support portions 43b of the lead frame member 40 are portions which are scheduled to form the second horizontal surface support portions 43b of the lead frame 4. One ends of the second horizontal surface support portions 43b are connected to the substrate connecting electrode portions 42, and the other ends of the second horizontal surface support portions 43b are positioned outside the inner substrate 2 and form free ends.

The insulation terminal connecting portion 44 of the lead frame member 40 is a portion which is scheduled to form the insulation terminal connecting portion 44 of the lead frame 4. As viewed in a plan view where the insulation terminal connecting portion 44 overlaps with the inner substrate 2, one end of the insulation terminal connecting portion 44 overlaps with the insulation terminal 24. The other end of the insulation terminal connecting portion 44 forms a free end when the insulation terminal connecting portion 44 is separated from the lead frame member 40 by cutting. However, the other end of the insulation terminal connecting portion 44 is connected to the frame portion 45a of the outer frame portion 45 until the insulation terminal connecting portion 44 is separated by cutting from the lead frame member 40.

Figure 3A:
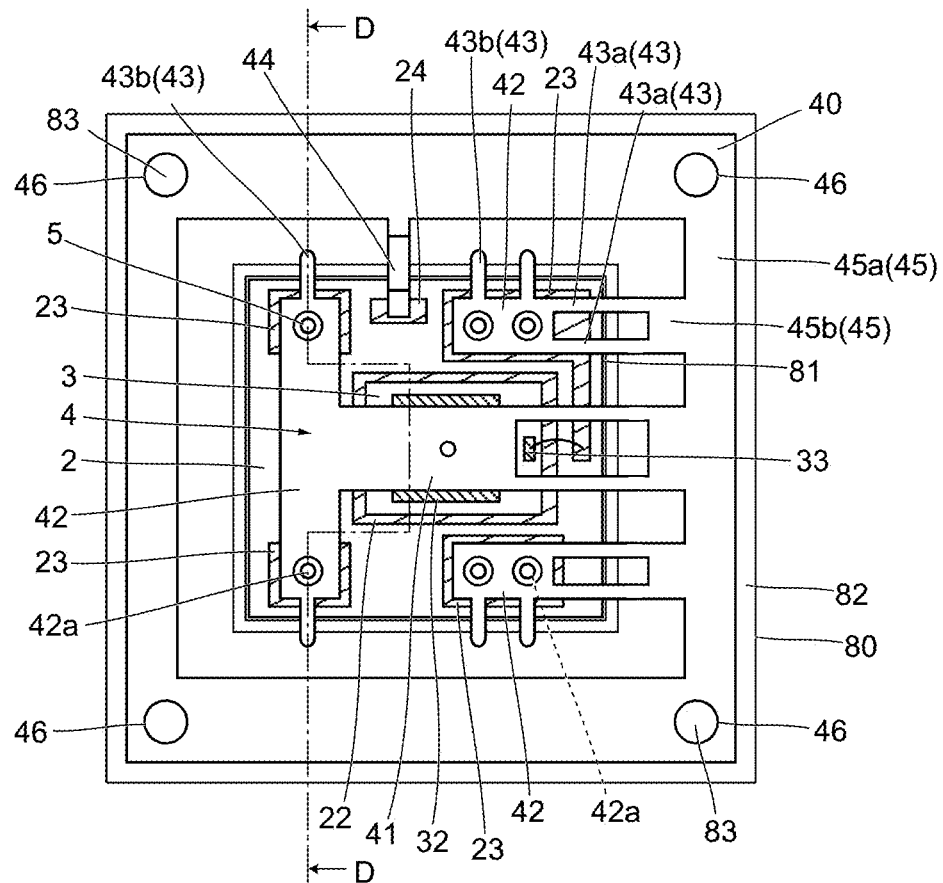
FIG. 3A and FIG. 3B are schematic views showing a supporting state of a lead frame member in a mounting step S1.
Figure 3B:
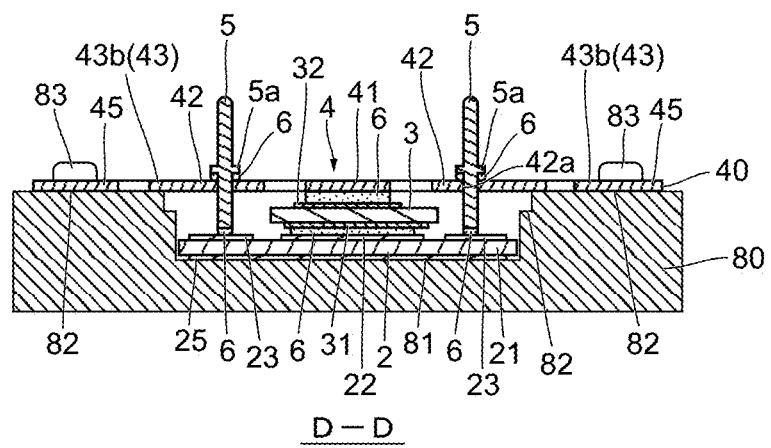
Figure 4A:
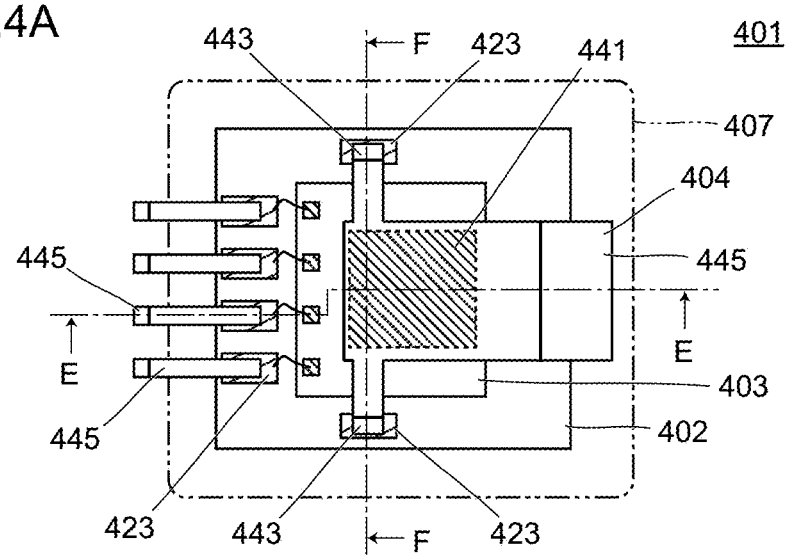
FIG. 4A to FIG. 4C are schematic views showing a conventional semiconductor device 401.
Figure 4B:
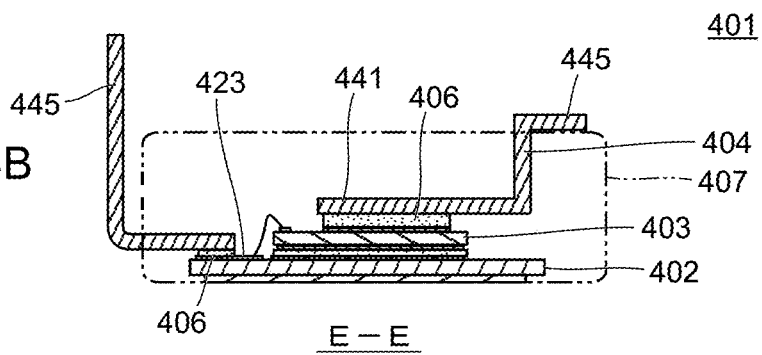
Figure 4C:
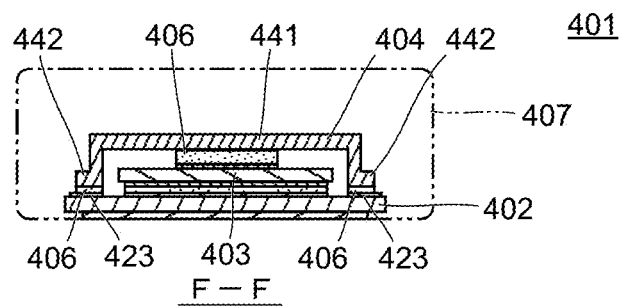
Figure 5:
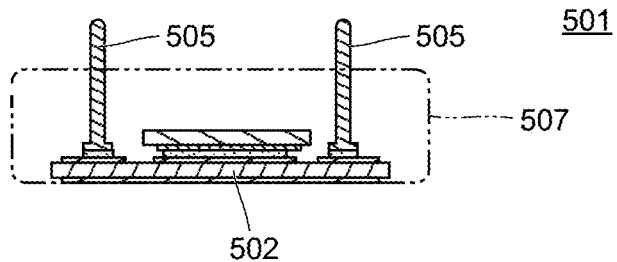
FIG. 5 is a schematic view showing a cross section of a conventional semiconductor device 501.

3. Mounting of Parts in Manufacturing Steps of Semiconductor Device 1 According to Embodiment In the manufacturing steps of the semiconductor device 1, mounting of parts is performed using a fixing jig 80 having a recessed portion which is indented inward as shown in FIG. 3A and FIG. 3B. The recessed portion of the fixing jig 80 has a bottom surface 81 which has an outer profile corresponding to an outer profile of the inner substrate 2 at the depth position A which corresponds to a distance between one surface of the lead frame 4 and one surface of the semiconductor chip 3. A lead frame member placing surface 82 is formed on an upper surface of the fixing jig 80, and positioning pins 83 project from portions of the lead frame member placing surface 82 corresponding to the positions of the positioning through holes 46 formed in the lead frame member 40. Both the bottom surface 81 and the lead frame member placing surface 82 are respectively formed of a flat surface, and are disposed parallel to each other.

In mounting parts in the manufacturing steps of the semiconductor device 1, as shown in FIG. 3B, the inner substrate 2, the semiconductor chip 3, the lead frame member 40 having the lead frame 4 inside thereof, the pin terminals 5, and the conductive bonding members 6 in an unsolidified state are placed on the fixing jig 80. Then, the conductive bonding members 6 are solidified.

To be more specific, firstly, the inner substrate 2 where the chip connecting terminal 22 faces upward is placed on the bottom surface 81 of the fixing jig 80. Next, the conductive bonding member 6 (solder material) is applied by coating to the chip connecting terminal 22 and the electric path terminals 23 of the inner substrate 2. Next, the semiconductor chip 3 where the collector electrode 31 faces downward is placed on the chip connecting terminal 22 of the inner substrate 2. Next, the conductive bonding member (solder material) is applied by coating to the emitter electrode 32 of the semiconductor chip 3. Next, the lead frame member 40 is placed on the lead frame placing surface 82 of the fixing jig 80. Next, the conductive bonding members 6 (solder materials) are applied by coating to the substrate connecting electrode portions 42 of the lead frame member 40. Next, the pin terminals 5 are mounted upright over the inner substrate 2 by being inserted into the through holes 42a formed in the substrate connecting electrode portions 42 of the lead frame member 40 such that lower ends of the pin terminals 5 are brought into contact with the conductive bonding members 6 on the electric path terminals 23. With such manufacturing steps, the inner substrate 2, the semiconductor chip 3, the lead frame 4, the pin terminals 5, and the conductive bonding members 6 are disposed on the fixing jig 80 as shown in FIG. 3A and FIG. 3B. Next, by heating the entirety of these parts, the inner substrate 2, the semiconductor chip 3, the lead frame member 40 having the lead frame 4 inside thereof, and the pin terminals 5 are integrated with each other by the conductive bonding members 6.

In mounting the parts in the manufacturing steps of the semiconductor device 1, the gate electrode 33 of the semiconductor chip 3 and the inner substrate 2 are electrically bonded to each other by suitably changing the order of steps within the above-mentioned specific steps depending on whether both the gate electrode 33 and the inner substrate 2 are connected to each other using a wire or using metal plates with a conductive bonding member interposed between the metal plates. As the solder material, a solder material in a paste form (so-called cream solder) or a solid solder material (so-called plate solder) can be used. These solder materials may be also used in combination.

4. Advantageous Effects Acquired by Embodiment

The semiconductor device 1 includes the lead frame 4 which has the horizontal surface support portions 43a, 43b which bulge from the chip connecting electrode portion 41 or the substrate connecting electrode portions 42 to the outside of the inner substrate 2 as viewed in a plan view. Accordingly, in the manufacture of the semiconductor device 1, the lead frame 4 can be arranged on the fixing jig 80 while suppressing inclining of the lead frame 4 by receiving the horizontal surface support portions 43a, 43b by the fixing jig 80. As a result, it is possible to acquire favorable pitch accuracy with respect to distal ends of the external connection terminals which are bonded to the lead frame 4. Further, the semiconductor device 1 includes the pin terminals 5 which are mounted upright in a direction perpendicular to the flat surface of the substrate connecting electrode portions 42 and hence, it is possible to provide the pin terminal structure where the external connection terminals are formed of the pin terminals 5. As a result, the semiconductor device 1 becomes a semiconductor device having a pin terminal structure having favorable pitch accuracy with respect to distal ends of the external connection terminals.

Further, according to the semiconductor device 1, the distal ends of the horizontal surface support portions 43a, 43b are brought into contact with neither the inner substrate 2 nor the semiconductor chip 3 and form free ends and hence, the distal ends of the horizontal surface support portions 43a, 43b can be used for leveling of the lead frame 4 at the time of manufacturing the semiconductor device 1.

In the semiconductor device 1, the chip connecting electrode portion 41, the substrate connecting electrode portions 42, and the horizontal surface support portions 43a, 43b of the lead frame 4 extend along the same plane and hence, bending is not applied to and between the respective components. Accordingly, flatness accuracy of the respective portions of the lead frame 4 can be easily enhanced. In addition, in the semiconductor device 1, the pin terminals 5 are electrically connected to the electric path terminals 23 formed on the inner substrate 2 via the conductive bonding members 6. With such a configuration, the semiconductor device 1 can easily acquire favorable pitch accuracy with respect to distal ends of the pin terminals 5 which form the external connection terminals.

In the semiconductor device 1, the lead frame 4 has the horizontal surface support mechanism 43 which is formed of the plurality of first horizontal surface support portions 43a and the plurality of second horizontal surface support portions 43b. In the horizontal surface support mechanism 43, the first horizontal surface support portions 43a bulge from one pair of opposite sides of the inner substrate 2, and the second horizontal surface support portions 43b bulge from the other pair of opposite sides of the inner substrate 2. Accordingly, in the semiconductor device 1, the lead frame 4 can be supported not only in a direction along one side but also in other directions at the time of manufacturing the semiconductor device 1 and hence, the lead frame 4 can be formed while suppressing inclining of the lead frame 4.

In the semiconductor device 1, the plurality of horizontal surface support portions 43a, 43b which form the horizontal surface support mechanism 43 of the lead frame 4 are formed with substantially the same width. Accordingly, in the semiconductor device 1, in solidifying the conductive bonding members 6 at the time of manufacturing the semiconductor device 1, the occurrence of irregularity in a thermal stress in the chip connecting electrode portion 41 and the substrate connecting electrode portions 42 of the lead frame 4 can be suppressed and hence, the lead frame 4 can be formed while suppressing inclining of the lead frame 4.

In the semiconductor device 1, the chip connecting electrode portion 41 of the lead frame 4 has the embossed projection 41a having the height corresponding to the thickness of the conductive bonding member 6 on the surface of the semiconductor chip 3. Accordingly, in the semiconductor device 1, even when the semiconductor chip 3 is lifted in solidifying the conductive bonding member 6 at the time of manufacturing the semiconductor device 1, it is possible to suppress the lifting of the semiconductor chip by the embossed projection 41a. Accordingly, it is possible to form the conductive bonding member 6 having a sufficient thickness necessary for maintaining its performance between the semiconductor chip 3 and the lead frame 4.

In the semiconductor device 1, the lead frame 4 has the insulation terminal connecting portion 44 which is electrically connected to the insulation terminal 24 of the inner substrate 2 via the conductive bonding member 6, and an entirety of the lead frame 4 except for a portion of the insulation terminal connecting portion 44 is covered by the mold resin 7. Accordingly, in the semiconductor device 1, the terminals connected to the electric circuits of the inner substrate 2 are not exposed to side surfaces of the semiconductor device 1 and hence, it is possible to acquire the semiconductor device 1 which is excellent in increasing a withstand voltage.

As viewed in a plan view where the lead frame member 40 overlaps with the inner substrate 2, the lead frame member 40 includes: the first horizontal surface support portions 43a which have one ends connected to the chip connecting electrode portion 41 or the substrate connecting electrode portions 42, and have the other ends connected to the outer frame portion 45; and the second horizontal surface support portions 43b which have one ends connected to the substrate connecting electrode portions 42, and have the other ends positioned outside the inner substrate 2 thus forming free ends. With such a configuration, according to the lead frame member 40, in the manufacture of the semiconductor device 1, the lead frame member 40 can be arranged while suppressing inclining of the lead frame member 40 by receiving the first and second horizontal surface support portions 43a, 43b by the fixing jig 80. As a result, it is possible to acquire favorable pitch accuracy with respect to distal ends of the external connection terminals which are bonded to the lead frame member 40. Further, as viewed in a plan view where the lead frame member 40 overlaps with the inner substrate 2, the lead frame member 40 includes the substrate connecting electrode portions 42 at least a portion of each of which overlaps with the electric path terminal 23 of the inner substrate 2. In this manner, according to the lead frame member 40, the pin terminals 5 can be bonded to the electric path terminals 23 of the inner substrate 2 via the substrate connecting electrode portions 42 and hence, it is possible to provide the pin terminal structure where the external connection terminals are formed of the pin terminals 5. As a result, the lead frame member 40 becomes a lead frame member used in the semiconductor device 1 having the pin terminal structure where the semiconductor device 1 can acquire favorable pitch accuracy with respect to distal ends of the external connection terminals.

According to the lead frame member 40, the outer frame portion 45, the chip connecting electrode portion 41, the substrate connecting electrode portions 42, and the first and second horizontal surface support portions 43a, 43b extend along the same plane and hence, flatness accuracy of the respective portions of the lead frame 4 which are formed by separating the inside of the lead frame member 40 from the outer frame portion 45 by cutting can be enhanced.

Further, according to the lead frame member 40, as viewed in a plan view where the lead frame member 40 overlaps with the inner substrate 2, the through holes 42a are formed at positions overlapping with the electric path terminals 23 and hence, the pin terminals 5 which have the distal ends thereof bonded to the electric path terminals 23 can be mounted upright over the inner substrate 2.

Further, as viewed in a plan view where the lead frame member 40 overlaps with the inner substrate 2 on which the insulation terminal 24 is formed, the lead frame member 40 further includes the insulation terminal connecting portion where one end of the insulation terminal connecting portion 44 overlaps with the insulation terminal 24 and the other end of the insulation terminal connecting portion 44 is connected to the outer frame portion 45. With such a configuration, according to the lead frame member 40, internal parts of the semiconductor device 1 can be supported by the outer frame portion 45 which is connected to the insulation terminal connecting portion 44 which is not connected to the electric circuits and hence, operability of resin sealing using the mold resin 7 can be enhanced.

Although the present invention has been described based on the above-mentioned embodiment heretofore, the present invention is not limited to the above-mentioned embodiment. Various modifications can be carried out without departing from the gist of the present invention, and the following modifications are also conceivable, for example.

(1) The numbers, the shapes, the positions, the sizes and the like of the constitutional elements described in the above-mentioned embodiment are provided for an exemplifying purpose, and can be modified within a range where the advantageous effects of the present invention are not jeopardized.

(2) In the above-mentioned embodiment, an IGBT is used as the semiconductor chip 3. However, the present invention is not limited to such a semiconductor chip. The semiconductor chip 3 may be other semiconductor element having three terminals (for example, a MOSFET. The semiconductor chip 3 may be a semiconductor element having two terminals (for example, a diode). The semiconductor chip 3 may be a semiconductor element having four or more terminals (for example, a thyristor may be used as a semiconductor element having four terminals).

(3) In the above-mentioned embodiment, the semiconductor device having one semiconductor chip is exemplified as the semiconductor device of the present invention. However, the present invention is not limited to such a semiconductor device. For example, a semiconductor device having two semiconductor chips may be used as the semiconductor device of the present invention, or a semiconductor device having three or more semiconductor chips may be used as the semiconductor device of the present invention.

(4) In the above-mentioned embodiment, a so-called vertical-type semiconductor device where the collector electrode is disposed on one surface of the semiconductor chip, and the emitter electrode and the gate electrode are disposed on the other surface of the semiconductor chip is used as the semiconductor device of the present invention. However, the present invention is not limited to such a semiconductor device. For example, a so-called lateral-type semiconductor device which has all electrodes on a surface of a semiconductor chip on a side opposite to a substrate side may be used as the semiconductor device of the present invention.

(5) With respect to the lead frame 4 of the above-mentioned embodiment, the description has been made while assuming that the chip connecting electrode portion 41, the substrate connecting electrode portions 42, and the first and second horizontal surface support portions 43a, 43b extend along the same plane. However, the present invention is not limited to such a configuration. It is preferable that the chip connecting electrode portion, the substrate connecting electrode portions, and the first and second horizontal surface support portions of the lead frame extend along the same plane. However, these portions may be partially displaced from each other in parallel.

(6) With respect to the lead frame 4 of the above-mentioned embodiment, the description has been made while assuming that the distal ends of the first horizontal surface support portions 43a are connected to the outer frame portion 45, and the distal ends of the second horizontal surface support portions 43b form the free ends. However, the present invention is not limited to such a configuration. For example, a lead frame member may be adopted where distal ends of first horizontal surface support portions form free ends, and distal ends of second horizontal surface support portions are connected to the outer frame portion. Further, for example, a lead frame member may also be adopted where distal ends of first and second horizontal surface support portions are connected to the outer frame portion.

(7) In the above-mentioned embodiment, the description has been made while assuming that the lead frame 4 includes the first and second horizontal surface support portions 43a, 43b. However, the present invention is not limited to such a configuration. For example, a lead frame may be adopted where the lead frame includes either one of the first horizontal surface support portions or the second horizontal surface support portions.

(8) In the pin terminals 5 of the above-mentioned embodiment, the description has been made while assuming that the pin terminal 5 has a circular columnar shape. However, the present invention is not limited to such a pin terminal. For example, a pin terminal may be adopted where the pin terminal has a rectangular columnar shape or a pin terminal has a thin plate shape.

The invention claimed is:

1. A semiconductor device, comprising:
a semiconductor chip having at least a first electrode, a second electrode and a third electrode;
a heat-radiation metal plate;
an inner substrate having a first surface on which the semiconductor chip is mounted, and a second surface which is opposite to the first surface and on which the heat-radiation metal plate is mounted;
a lead frame having a first surface and a second surface, and including a plurality of flat plate metal pieces on a plane;
a molding resin which seals the semiconductor chip, the inner substrate and the lead frame, the molding resin directly contacting both the first surface and the second surface of the lead frame; and
a pin terminal formed on the first surface of the inner substrate and extending in a direction perpendicular to the plane of the lead frame, a base end of the pin terminal being electrically connected to an electric path terminal of the inner substrate, and a distal end of the pin terminal projecting from the molding resin and forming an external connection terminal, wherein
the lead frame further includes:
a chip connecting electrode portion electrically connected to the first electrode of the semiconductor chip via a first conductive bonding member;
a substrate connecting electrode portion electrically connected to one of the second electrode or the third electrode of the semiconductor chip via a second conductive bonding member;

a horizontal surface support mechanism which projects outwardly from the chip connecting electrode portion or from the substrate connecting electrode portions in a direction parallel with the plane of the lead frame, wherein a distal projecting end of the horizontal surface support mechanism is sealed within the molding resin; and an insulation terminal connecting portion which protrudes from the molding resin in the direction parallel with the plane of the lead frame, the insulation terminal connecting portion being electrically connected to an insulation terminal of the inner substrate, the insulation terminal electrically isolated from all of the first electrode, the second electrode and the third electrode of the semiconductor chip, and an entirety of the semiconductor chip, the inner substrate, the pin terminal and the lead frame is sealed within the molding resin except for
(1) an exposed surface of the heat-radiation metal plate other than a surface on which the inner substrate is mounted,
(2) the distal end of the pin terminal, and
(3) a distal end of the insulation terminal connecting portion which protrudes from the molding resin.

2. The semiconductor device according to claim 1, wherein the distal projecting end of the horizontal surface support mechanism is in direct contact with neither the inner substrate nor the semiconductor chip.

3. The semiconductor device according to claim 2, wherein the chip connecting electrode portion, the substrate connecting electrode portion, and the horizontal surface support mechanism extend along a same plane.

4. The semiconductor device according to claim 3, wherein
the semiconductor device includes a plurality of pin terminals, and
each of the plurality of pin terminals is electrically connected to a corresponding one of the first, the second or the third electrodes of the semiconductor chip.

5. The semiconductor device according to claim 4, wherein the base end of the pin terminal is electrically connected, by the electric path terminal, to any one of the first, the second or the third electrode of the semiconductor chip.

6. The semiconductor device according to claim 5, wherein
the horizontal surface support mechanism has
first horizontal surface support portions which project to one direction parallel with the plane of the lead frame, and
second horizontal surface support portions which project to another direction parallel with the plane of the lead frame.

7. The semiconductor device according to claim 6, wherein the horizontal surface support mechanism comprises a plurality of horizontal surface support portions which have substantially a same width.

8. The semiconductor device according to claim 7, wherein the chip connecting electrode portion has an embossed projection having a height corresponding to a thickness of the first conductive bonding member on a surface of the semiconductor chip.

9. The semiconductor device according to claim 1, wherein
the semiconductor device includes a plurality of pin terminals including the pin terminal, and
each of the plurality of pin terminals is electrically connected to a corresponding one of the first, the second or the third electrodes of the semiconductor chip.

10. The semiconductor device according to claim 1, wherein the base end of the pin terminal is electrically connected, by the electric path terminal, to any one of the first, the second or the third electrode of the semiconductor chip.

11. The semiconductor device according to claim 1, wherein
the horizontal surface support mechanism has
first horizontal surface support portions which project from one pair of opposite sides of the inner substrate, and
second horizontal surface support portions which project from another pair of opposite sides of the inner substrate.

12. The semiconductor device according to claim 1, wherein the horizontal surface support mechanism comprises a plurality of horizontal surface support portions which have substantially a same width.

13. The semiconductor device according to claim 1, wherein the chip connecting electrode portion has an embossed projection having a height corresponding to a thickness of the first conductive bonding member on a surface of the semiconductor chip.

* * * * *

UNITED STATES PATENT AND TRADEMARK OFFICE
CERTIFICATE OF CORRECTION

| | |
|---|---|
| PATENT NO. | : 11,776,929 B2 |
| APPLICATION NO. | : 15/734996 |
| DATED | : October 3, 2023 |
| INVENTOR(S) | : Soichiro Umeda and Atsushi Kyutoku |

It is certified that error appears in the above-identified patent and that said Letters Patent is hereby corrected as shown below:

On the Title Page

The PCT Information should read as follows:

(22) PCT Filed: Apr. 10, 2019

(86) PCT No.: PCT/JP2019/015614
§ 371 (c)(1),
(2) Date: Dec. 4, 2020

(87) PCT Pub. No.: WO2020/208741
PCT Pub. Date: Oct. 15, 2020

Signed and Sealed this
Fifth Day of December, 2023

Katherine Kelly Vidal
*Director of the United States Patent and Trademark Office*